(12) United States Patent
Jiang

(10) Patent No.: US 10,068,955 B2
(45) Date of Patent: Sep. 4, 2018

(54) ARRAY SUBSTRATE OF OLED DISPLAY DEVICE AND MANUFACTURING METHOD THEREOF

(71) Applicant: SHENZHEN CHINA STAR OPTOELECTRONICS TECHNOLOGY CO., LTD., Shenzhen (CN)

(72) Inventor: Chunsheng Jiang, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 60 days.

(21) Appl. No.: 15/327,403

(22) PCT Filed: Jan. 13, 2017

(86) PCT No.: PCT/CN2017/071162
§ 371 (c)(1),
(2) Date: Jan. 19, 2017

(65) Prior Publication Data
US 2018/0212010 A1   Jul. 26, 2018

(30) Foreign Application Priority Data
Dec. 30, 2016 (CN) .......................... 2016 1 1262923

(51) Int. Cl.
*H01L 21/00* (2006.01)
*H01L 27/32* (2006.01)
(Continued)

(52) U.S. Cl.
CPC .... *H01L 27/3262* (2013.01); *H01L 21/02532* (2013.01); *H01L 21/02592* (2013.01); *H01L 21/02631* (2013.01); *H01L 21/266* (2013.01); *H01L 21/26513* (2013.01); *H01L 21/308* (2013.01); *H01L 21/30604* (2013.01); *H01L 21/31111* (2013.01); *H01L 21/32139* (2013.01);
(Continued)

(58) Field of Classification Search
CPC ......... H01L 21/02532; H01L 21/02592; H01L 21/02631; H01L 21/26513
USPC ...................................... 257/40, 59, 72, 432
See application file for complete search history.

(56) References Cited

U.S. PATENT DOCUMENTS 9,099,497 B2   8/2015   Jiang
9,543,415 B2   1/2017   Wang et al.
(Continued)

FOREIGN PATENT DOCUMENTS

CN   102655118 A   9/2012
CN   102683276 A   9/2012
(Continued)

*Primary Examiner* — Tan N Tran
(74) *Attorney, Agent, or Firm* — JMD Davis Ben-David

(57) ABSTRACT

A manufacturing method of an array substrate of an OLED display device is provided. Active areas of a first thin film transistor T1 and a second thin film transistor T2 are formed by a first mask; channel doping areas, source electrode doping areas and drain electrode doping areas of T1 and T2 are formed by a second mask; gate electrodes of T1 and T2 are formed by a third mask; vias are formed by a fourth mask; source electrodes and drain electrodes of T1 and T2, a data line and a pixel electrode are formed by a fifth mask. The manufacturing method can simplify the process steps.

15 Claims, 3 Drawing Sheets

(51) Int. Cl.
    *H01L 21/265*      (2006.01)
    *H01L 21/3213*      (2006.01)
    *H01L 21/768*      (2006.01)
    *H01L 21/311*      (2006.01)
    *H01L 51/56*      (2006.01)
    *H01L 29/49*      (2006.01)
    *H01L 21/02*      (2006.01)
    *H01L 21/306*      (2006.01)
    *H01L 21/308*      (2006.01)
    *H01L 21/266*      (2006.01)
    *H01L 29/66*      (2006.01)
    *H01L 29/786*      (2006.01)
    *H01L 27/12*      (2006.01)
    *H01L 51/50*      (2006.01)

(52) U.S. Cl.
    CPC .... *H01L 21/76802* (2013.01); *H01L 27/1222* (2013.01); *H01L 27/1288* (2013.01); *H01L 27/3248* (2013.01); *H01L 27/3258* (2013.01); *H01L 27/3276* (2013.01); *H01L 29/4908* (2013.01); *H01L 29/66757* (2013.01); *H01L 29/78666* (2013.01); *H01L 51/56* (2013.01); *H01L 27/124* (2013.01); *H01L 27/127* (2013.01); *H01L 27/1248* (2013.01); *H01L 27/1262* (2013.01); *H01L 51/5056* (2013.01); *H01L 51/5088* (2013.01); *H01L 2227/323* (2013.01)

(56) References Cited

U.S. PATENT DOCUMENTS

2003/0085401 A1    5/2003    Joo
2005/0253171 A1    11/2005    Kang et al.
2016/0268319 A1*    9/2016    Long .................. H01L 27/1288

FOREIGN PATENT DOCUMENTS

CN      103489827 A      1/2014
CN      106057825 A      10/2016

* cited by examiner

ARRAY SUBSTRATE OF OLED DISPLAY DEVICE AND MANUFACTURING METHOD THEREOF

CROSS-REFERENCE TO RELATED APPLICATIONS

This is the U.S. National Stage of International Patent Application No. PCT/CN2017/071162, filed Jan. 13, 2017, which in turn claims the benefit of China Patent Application No. 201611262923.X, filed Dec. 30, 2016.

FIELD OF THE INVENTION

The present invention relates to the field of display technologies, and more particularly to an array substrate of an OLED display device and a manufacturing method thereof.

BACKGROUND OF THE INVENTION

A manufacturing method of a conventional array substrate of an OLED display device includes: during processing an active layer, continuously depositing buffer layers and amorphous silicon layers; doping channels of thin film transistors by a first mask; defining an active area by a second mask, and depositing a silica as a gate electrode oxide layer; depositing a metal layer and defining a first metal layer (also called scan electrode) by a third mask; using the first metal layer as a mask to form a light doping drain area with a high resistance value by injecting low dose ions; defining N-type and P-type doped low temperature poly silicon areas, and using a silica/silicon nitride film as a protecting layer; defining contact holes and a second metal layer (also called signal electrode) by a sixth mask and a seventh mask, respectively, and coating an organic material as a flattened protecting layer by different methods; defining vias by a eighth mask; and finally, depositing a transparent electro-conductive electrode and then defining it by a ninth mask, and transforming an amorphous indium tin oxide into a polycrystalline indium tin oxide film by a high temperature annealing process.

As mentioned above, the conventional array substrate of the OLED display device has a more complex manufacturing method, and a lower production efficiency. Furthermore, because the manufacturing process is more complex, the related procedures will be influenced by electro-conductive particles produced during the processes, so as to influence the quality of the products.

SUMMARY OF THE INVENTION

The present invention provides a manufacturing method of an array substrate of an OLED display device, the manufacturing process of which is simple, so as to solve technical problems of the prior art: a conventional array substrate of an OLED display device has a more complex manufacturing method, and a lower production efficiency; and because the manufacturing process is more complex, the related procedures will be influenced by electro-conductive particles produced during the processes, so as to influence the quality of the products.

To solve the above-mentioned problems, the present invention provides technical solutions as follows:

The present invention provides a manufacturing method of an array substrate of an OLED display device, which comprises steps of:

providing a substrate;

using a first mask pattern to form a semiconductor pattern on the substrate, which includes active areas of a first thin film transistor and a second thin film transistor in each driving unit;

based on the above pattern, using a second mask pattern to form an electro-conductive channel of the first thin film transistor and an electro-conductive channel of the second thin film transistor on the substrate; and using an ion-injection method to form a channel doping area, and form a source electrode doping area and a drain electrode doping area beside two sides of each of the channel doping areas;

based on the above pattern, forming a pattern of an insulation layer;

based on the above pattern, using a third mask pattern to form a pattern of a first metal layer, which includes a gate electrode of the first thin film transistor and a gate electrode of the second thin film transistor;

based on the above pattern, forming a pattern of an interlayer; and using an fourth mask pattern to form a via which is in the first thin film transistor and passes through the insulation layer and the interlayer, and a via which is in the second thin film transistor and passes through the insulation layer and the interlayer;

based on the above pattern, using a fifth mask pattern to form a pattern of a second metal layer, which includes a source electrode and a drain electrode of the first thin film transistor, a source electrode and a drain electrode of the second thin film transistor, and a data line and a pixel electrode; and based on the above pattern, forming a protecting layer, and etching to remove the protecting layer on the surface of the pixel electrode through a sixth mask pattern.

Based on the above pattern, forming a hole-inject layer and a hole-transport layer.

Preferably, the second metal layer is selected from a material of a graphene film.

Preferably, before forming the semiconductor pattern, a buffer layer is formed on the substrate.

Preferably, the step of forming a semiconductor pattern on the substrate comprises: using a method of physical vapor deposition to deposit a layer of a-Si film on the substrate, and then using a wet etching method to process the a-Si film by the first mask pattern, so as to form the active areas of the first thin film transistor and the second thin film transistor.

The present invention further provides a manufacturing method of an array substrate of an OLED display device, which comprises steps of:

providing a substrate;

using a first mask pattern to form a semiconductor pattern on the substrate, which includes active areas of a first thin film transistor and a second thin film transistor in each driving unit;

based on the above pattern, using a second mask pattern to form an electro-conductive channel of the first thin film transistor and an electro-conductive channel of the second thin film transistor on the substrate; and using an ion-injection method to form a channel doping area, and form a source electrode doping area and a drain electrode doping area beside two sides of each of the channel doping areas;

based on the above pattern, forming a pattern of an insulation layer;

based on the above pattern, using a third mask pattern to form a pattern of a first metal layer, which includes a gate electrode of the first thin film transistor and a gate electrode of the second thin film transistor;

based on the above pattern, forming a pattern of an interlayer; and using an fourth mask pattern to form a via which is in the first thin film transistor and passes through the insulation layer and the interlayer, and a via which is in the second thin film transistor and passes through the insulation layer and the interlayer; and based on the above pattern, using a fifth mask pattern to form a pattern of a second metal layer, which includes a source electrode and a drain electrode of the first thin film transistor, a source electrode and a drain electrode of the second thin film transistor, and a data line and a pixel electrode.

Based on the above pattern, forming a hole-inject layer and a hole-transport layer.

Preferably, the second metal layer is selected from a material of a graphene film.

Preferably, before forming the semiconductor pattern, a buffer layer is formed on the substrate.

Preferably, the step of forming a semiconductor pattern on the substrate comprises: using a method of physical vapor deposition to deposit a layer of a-Si film on the substrate, and then using a wet etching method to process the a-Si film by the first mask pattern, so as to form the active areas of the first thin film transistor and the second thin film transistor.

According to the above-mentioned object of the present invention, the present invention further provides an array substrate of an OLED display device, which comprises:

a substrate;

an active layer formed on the substrate and including a channel doping area, a source electrode doping area, and a drain electrode doping area of a first thin film transistor; and a channel doping area, a source electrode doping area, and a drain electrode doping area of a second thin film transistor;

a gate electrode insulation layer formed above the substrate;

a first metal layer formed above the substrate and including a gate electrode of the first thin film transistor and a gate electrode of the second thin film transistor;

an interlayer formed above the substrate;

vias passing through the interlayer and the gate electrode insulation layer; and a second metal layer formed above the substrate and including a source electrode and a drain electrode of the first thin film transistor; a source electrode and a drain electrode of the second thin film transistor; and a data line and a pixel electrode;

wherein, the source electrode of the first thin film transistor is connected with the data line; the drain electrode of the first thin film transistor is connected with the gate electrode of the second thin film transistor; and the drain electrode of the second thin film transistor is connected with the pixel electrode.

Preferably, a protecting layer is formed above the substrate, and a portion of the protecting layer which is on the surface of the pixel electrode is etched.

Preferably, a hole-inject layer and a hole-transport layer are formed above the substrate.

Preferably, the second metal layer is selected from a material of a graphene film.

Preferably, a buffer layer is formed between the active layer and the substrate.

The advantageous effects of the present invention are: compared with a manufacturing method of a conventional array substrate, in the manufacturing method of the present invention, the data line, the source electrode, the drain electrode, and the pixel electrode can be obtained by the same mask, so that the required masks for processing the different electrodes are saved, and the required masks for forming the vias to connect with the electrodes in the different layers are also reduced. Thus, the exposing processes is reduced; the process complexity is lowered; the material is saved; the processing time is shortened; and the processing cost is simultaneously decreased.

DESCRIPTION OF THE DRAWINGS

In order to more clearly illustrate technical solutions of embodiments or in the prior art, accompany drawings which need to be used in the description of the embodiments or the prior art will be simply introduced. Obviously, the accompany drawings in the following description are merely some embodiments, and for those of ordinary skill in the art, other embodiments can further be obtained according to these accompany drawings without contributing any creative work.

DETAILED DESCRIPTION OF THE PREFERRED EMBODIMENTS

Figure 1A:
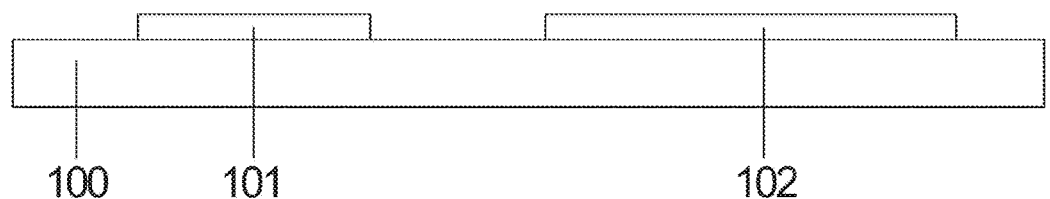
FIGS. 1a to 1f are schematic views showing the manufacturing processes of an array substrate of an OLED display device of the present invention.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inside, outer, side, etc., are only directions with reference to the accompanying drawings, so that the used directional terms are used to describe and understand the present invention, but the present invention is not limited thereto. In the drawings, units with similar structures use the same numerals.

The present invention can solve the technical problems of the prior art: a conventional array substrate of an OLED display device has a more complex manufacturing method, and a lower production efficiency; and because it needs more manufacturing processes, the cost is increased, and the related procedures will be influenced by electro-conductive particles produced during the processes, so as to influence the quality of the products.

The present invention provides a manufacturing method of an array substrate of an OLED display device, which comprises the following steps of:

S101: refer now to FIG. 1a, providing a substrate 100; and using a first mask pattern to form a semiconductor pattern on the substrate 100, which includes an active area 101 of a first thin film transistor and an active area 102 of a second thin film transistor in each driving unit.

Specifically, by a method of physical vapor deposition (PVD), a layer of a-Si (amorphous silicon) film is deposited on the substrate 100, and a wet etching method is used to process the a-Si film by the first mask pattern, so as to form the active area 101 of the first thin film transistor and the active area 102 of the second thin film transistor.

Figure 1B:
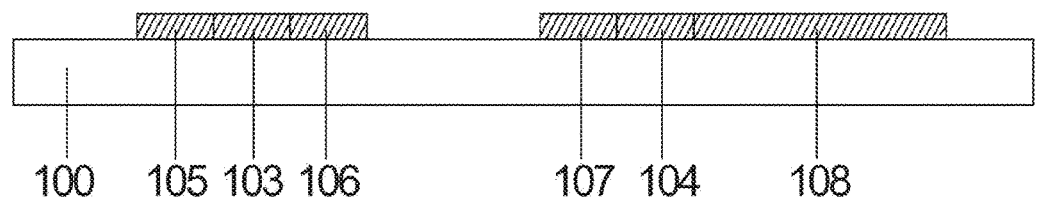

S102: refer now to FIG. 1b, based on the above pattern, using a second mask pattern to form an electro-conductive channel of the first thin film transistor and an electro-conductive channel of the second thin film transistor on the substrate 100; and using an ion-injection method to form a channel doping area 103 of the first thin film transistor, a channel doping area 104 of the second thin film transistor, a source electrode doping area 105 and a drain electrode doping area 106 beside two sides of the channel doping area 103 of the first thin film transistor, and a source electrode doping area 107 and a drain electrode doping area 108 beside two sides of the channel doping area 104 of the second thin film transistor.

Figure 1C:
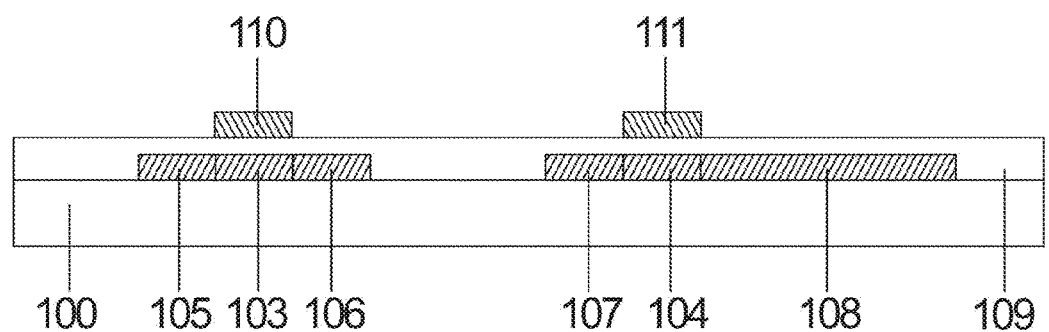

S103: refer now to FIG. 1c, based on the above pattern, forming a pattern of an insulation layer 109.

Specifically, by a method of chemical vapor deposition (CVD), the insulation layer 109 is deposited on the substrate 100 and the semiconductor pattern.

S104: refer now to FIG. 1c, based on the above pattern, using a third mask pattern to form a pattern of a first metal layer, which includes a gate electrode 110 of the first thin film transistor and a gate electrode 111 of the second thin film transistor.

Specifically, by a method of PVD, the first metal layer is deposited on the insulation layer 109, and a wet etching method is used to process the first metal layer by the third mask pattern, so as to form the gate electrode 110 of the first thin film transistor and the gate electrode 111 of the second thin film transistor.

Figure 1D:
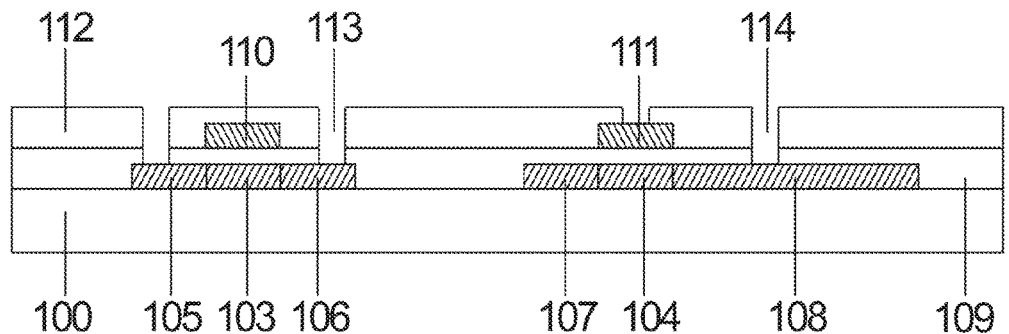

S105: refer now to FIG. 1d, based on the above pattern, forming a pattern of an interlayer 112; and using an fourth mask pattern to form a via 113 which is in the first thin film transistor and passes through the insulation layer 109 and the interlayer, and a via 114 which is in the second thin film transistor and passes through the insulation layer 109 and the interlayer.

Specifically, a wet etching method is used to process the interlayer 112 and the insulation layer 109 by the fourth mask pattern, so as to form vias passing through the insulation layer 109 and the interlayer, which includes a via configured to connect the source electrode and the source electrode doping area 105 of the first thin film transistor; a via configured to connect the drain electrode and the drain electrode doping area 106; a via configured to connect the drain electrode and the gate electrode 111 of the second thin film transistor; a via configured to connect the source electrode and the source electrode doping area 107 of the second thin film transistor; and a via configured to connect the drain electrode and the drain electrode doping area 108 of the second thin film transistor.

Figure 1E:
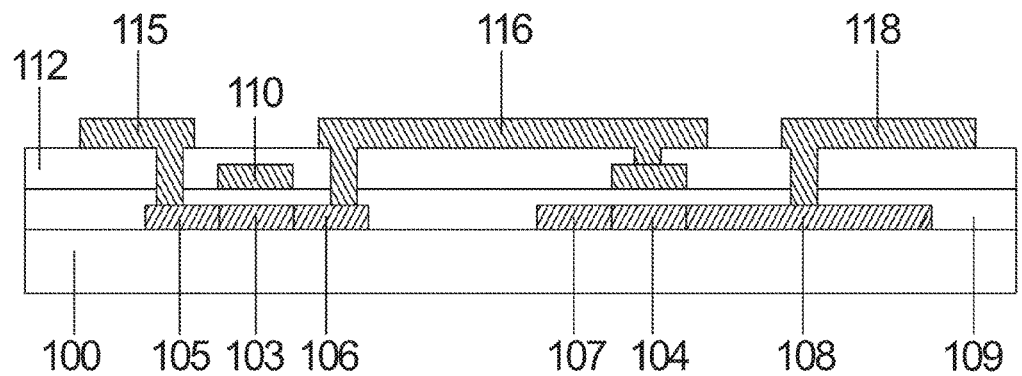

S106: refer now to FIG. 1e, based on the above pattern, using a fifth mask pattern to form a pattern of a second metal layer, which includes a source electrode 115 and a drain electrode 116 of the first thin film transistor, and a source electrode and a drain electrode 118 of the second thin film transistor, and a data line and a pixel electrode.

Specifically, the source electrode of the second thin film transistor is positioned in the same layer of the drain electrode 116 of the first thin film transistor, and are positioned behind the drain electrode 116 of the first thin film transistor, so that the source electrode of the second thin film transistor is covered, and is not shown in the figures.

Figure 1F:
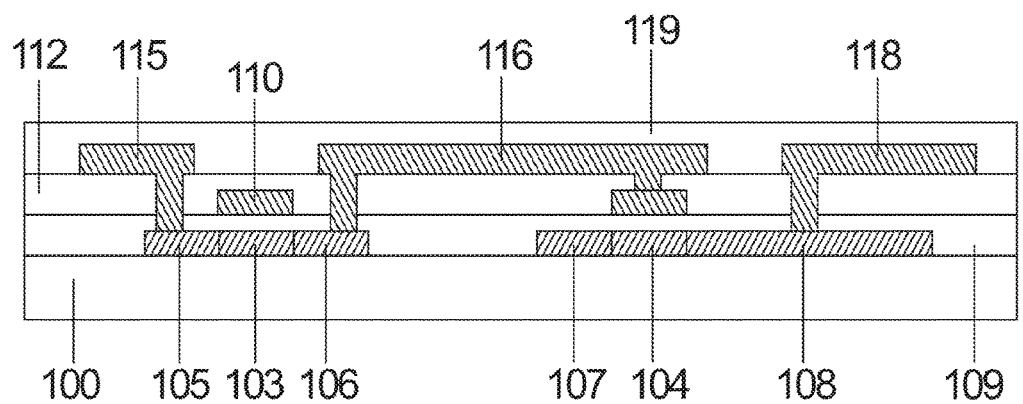

Finally, refer now to FIG. 1f, based on the above pattern, depositing a PV protecting layer 119, and etching and removing the PV protecting layer 119 on the surface of the pixel electrode, so as to finish the manufacture of the array substrate.

Specifically, before manufacturing semiconductor layers, a buffer layer is formed on the substrate.

Specifically, because the source electrode and drain electrode of the first thin film transistor, the source electrode and drain electrode of the second thin film transistor, and pixel electrode are manufactured in the same layer, they are all selected from a material of a graphene film with high electric conductivity and high transparency.

Figure 2:
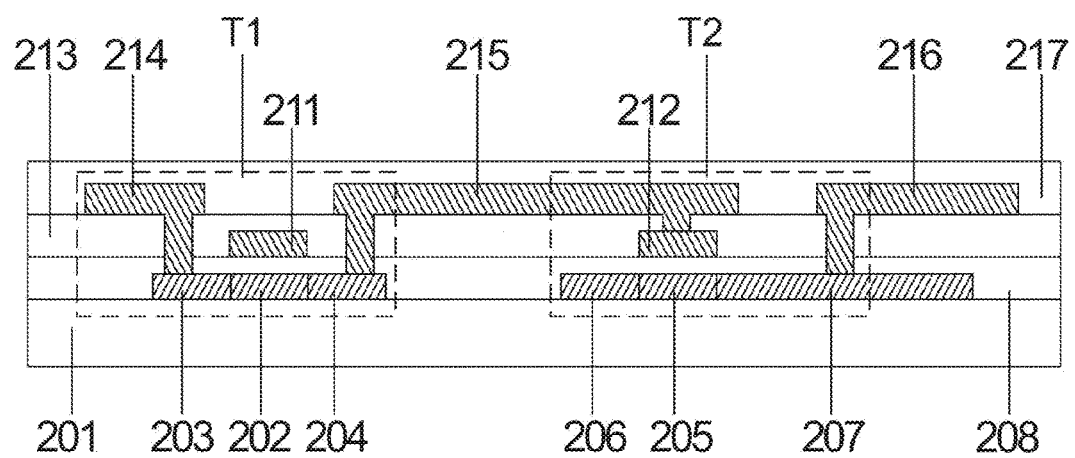
FIG. 2 is a schematic cross-sectional view of the array substrate of the OLED display device of the present invention.

According to the above-mentioned method, an array substrate of an OLED display device is obtained. refer now to FIG. 2, the array substrate of the OLED display device of the embodiment includes:

A substrate 201; an active layer formed on the substrate 201 and including a channel doping area 202, a source electrode doping area 203, and a drain electrode doping area 204 of a first thin film transistor T1; and a channel doping area 205, a source electrode doping area 206, and a drain electrode doping area 207 of a second thin film transistor T2; a gate electrode insulation layer 208 formed above the substrate 201; a first metal layer formed above the substrate 201 and including a gate electrode 211 of the first thin film transistor T1 and a gate electrode 212 of the second thin film transistor T2; an interlayer 213 formed above the substrate 201; vias passing through the interlayer 213 and the gate electrode insulation layer 208; and a second metal layer formed above the substrate 201 and including a source electrode 214 and a drain electrode 215 of the first thin film transistor T1; a source electrode and a drain electrode 216 of the second thin film transistor T2; and a data line and a pixel electrode; wherein, the source electrode 214 of the first thin film transistor T1 is connected with the data line; the drain electrode 215 of the first thin film transistor T1 is connected with the gate electrode 212 of the second thin film transistor T2; and the drain electrode 216 of the second thin film transistor T2 is connected with the pixel electrode.

After the above-mentioned steps being finished, a hole-inject layer, a hole-transport layer, an emitting layer, an electron-transport layer, and an anode electrode are manufactured on the pixel electrode of the array substrate in order, so as to obtain the OLED display device.

A drive unit of the OLED display device is composed of two of the thin film transistors (TFT) and one storage capacitor Cst, wherein the gate electrode of the first thin film transistor T1 inputs a scan signal Vgate; the source electrode of the first thin film transistor T1 inputs a data signal Vdata; the drain electrode of the first thin film transistor T1 is connected to the gate electrode of the second thin film transistor T2; the source electrode of the second thin film transistor T2 is connected to a digital power Vdd; the drain electrode of the second thin film transistor T2 is connected to a digital ground Vss; the storage capacitor Cst is disposed between the gate electrode and source electrode of the second thin film transistor T2; and an light-emitting diode is series connected between the drain electrode of the second thin film transistor T2 and the digital ground Vss.

Preferably, a protecting layer 217 is formed above the substrate 201, and a portion of the protecting layer 217 which is on the surface of the pixel electrode is etched.

Preferably, the hole-inject layer and the hole-transport layer are formed above the substrate 201.

Preferably, the second metal layer is selected from a material of a graphene film.

Preferably, a buffer layer is formed between the active layer and the substrate 201.

The advantageous effects of the present invention are: compared with a manufacturing method of a conventional array substrate, in the manufacturing method of the present invention, the data line, the source electrode, the drain electrode, and the pixel electrode can be obtain by the same mask, so that the required masks for processing the different electrodes are saved, and the required masks for forming the vias to connect with the electrodes in the different layers are also reduced. Thus, the exposing processes is reduced; the process complexity is lowered; the material is saved; the processing time is shortened; and the processing cost is simultaneously decreased.

The present invention has been described with preferred embodiments thereof and it is understood that many changes and modifications to the described embodiment can be carried out without departing from the scope and the spirit of the invention that is intended to be limited only by the appended claims.

What is claimed is:

1. A manufacturing method of an array substrate of an OLED display device, comprising steps of:
   providing a substrate;
   using a first mask pattern to form a semiconductor pattern on the substrate, which includes active areas of a first thin film transistor and a second thin film transistor in each driving unit;
   based on the above pattern, using a second mask pattern to form an electro-conductive channel of the first thin film transistor and an electro-conductive channel of the second thin film transistor on the substrate; and using an ion-injection method to form a channel doping area, and form a source electrode doping area and a drain electrode doping area beside two sides of each of the channel doping areas;
   based on the above pattern, forming a pattern of an insulation layer;
   based on the above pattern, using a third mask pattern to form a pattern of a first metal layer, which includes a gate electrode of the first thin film transistor and a gate electrode of the second thin film transistor;
   based on the above pattern, forming a pattern of an interlayer; and using an fourth mask pattern to form a via which is in the first thin film transistor and passes through the insulation layer and the interlayer, and a via which is in the second thin film transistor and passes through the insulation layer and the interlayer;
   based on the above pattern, using a fifth mask pattern to form a pattern of a second metal layer, which includes a source electrode and a drain electrode of the first thin film transistor, a source electrode and a drain electrode of the second thin film transistor, and a data line and a pixel electrode; and
   based on the above pattern, forming a protecting layer, and etching to remove the protecting layer on the surface of the pixel electrode through a sixth mask pattern.

2. The manufacturing method according to claim 1, wherein based on the above pattern, forming a hole-inject layer and a hole-transport layer.

3. The manufacturing method according to claim 1, wherein the second metal layer is selected from a material of a graphene film.

4. The manufacturing method according to claim 1, wherein before forming the semiconductor pattern, a buffer layer is formed on the substrate.

5. The manufacturing method according to claim 1, wherein the step of forming a semiconductor pattern on the substrate comprises:
   using a method of physical vapor deposition to deposit a layer of a-Si film on the substrate, and then using a wet etching method to process the a-Si film by the first mask pattern, so as to form the active areas of the first thin film transistor and the second thin film transistor.

6. A manufacturing method of an array substrate of an OLED display device, comprising steps of:
   providing a substrate;
   using a first mask pattern to form a semiconductor pattern on the substrate, which includes active areas of a first thin film transistor and a second thin film transistor in each driving unit;
   based on the above pattern, using a second mask pattern to form an electro-conductive channel of the first thin film transistor and an electro-conductive channel of the second thin film transistor on the substrate; and using an ion-injection method to form a channel doping area, and form a source electrode doping area and a drain electrode doping area beside two sides of each of the channel doping areas;
   based on the above pattern, forming a pattern of an insulation layer;
   based on the above pattern, using a third mask pattern to form a pattern of a first metal layer, which includes a gate electrode of the first thin film transistor and a gate electrode of the second thin film transistor;
   based on the above pattern, forming a pattern of an interlayer; and using an fourth mask pattern to form a via which is in the first thin film transistor and passes through the insulation layer and the interlayer, and a via which is in the second thin film transistor and passes through the insulation layer and the interlayer; and
   based on the above pattern, using a fifth mask pattern to form a pattern of a second metal layer, which includes a source electrode and a drain electrode of the first thin film transistor, a source electrode and a drain electrode of the second thin film transistor, and a data line and a pixel electrode.

7. The manufacturing method according to claim 6, wherein based on the above pattern, forming a hole-inject layer and a hole-transport layer.

8. The manufacturing method according to claim 6, wherein the second metal layer is selected from a material of a graphene film.

9. The manufacturing method according to claim 6, wherein before forming the semiconductor pattern, a buffer layer is formed on the substrate.

10. The manufacturing method according to claim 6, wherein the step of forming a semiconductor pattern on the substrate comprises:
    using a method of physical vapor deposition to deposit a layer of a-Si film on the substrate, and then using a wet etching method to process the a-Si film by the first mask pattern, so as to form the active areas of the first thin film transistor and the second thin film transistor.

11. An array substrate of an OLED display device, comprising:
    a substrate;
    an active layer formed on the substrate and including: a channel doping area, a source electrode doping area and a drain electrode doping area of a first thin film transistor; and a channel doping area, a source electrode doping area and a drain electrode doping area of a second thin film transistor;
    a gate electrode insulation layer formed above the substrate;
    a first metal layer formed above the substrate and including a gate electrode of the first thin film transistor and a gate electrode of the second thin film transistor;
    an interlayer formed above the substrate;
    vias passing through the interlayer and the gate electrode insulation layer; and
    a second metal layer formed above the substrate and including: a source electrode and a drain electrode of the first thin film transistor; a source electrode and a drain electrode of the second thin film transistor; and a data line and a pixel electrode;

wherein the source electrode of the first thin film transistor is connected with the data line; the drain electrode of the first thin film transistor is connected with the gate electrode of the second thin film transistor; and the drain electrode of the second thin film transistor is connected with the pixel electrode.

12. The array substrate according to claim 11, wherein a protecting layer is formed above the substrate, and a portion of the protecting layer which is on the surface of the pixel electrode is etched.

13. The array substrate according to claim 11, wherein a hole-inject layer and a hole-transport layer are formed above the substrate.

14. The array substrate according to claim 11, wherein the second metal layer is selected from a material of a graphene film.

15. The array substrate according to claim 11, wherein a buffer layer is formed between the active layer and the substrate.

* * * * *